（12）United States Patent
Sohn et al.

(10) Patent No.: US 7,293,356 B2
(45) Date of Patent: Nov. 13, 2007

(54) METHOD OF FABRICATING PRINTED CIRCUIT BOARD HAVING EMBEDDED MULTI-LAYER PASSIVE DEVICES

(75) Inventors: Seung Hyun Sohn, Gyeonggi-do (KR); Yul Kyo Chung, Gyeonggi-do (KR); Hyun Ju Jin, Busan (KR); Eun Tae Park, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 160 days.

(21) Appl. No.: 11/325,557

(22) Filed: Jan. 3, 2006

(65) Prior Publication Data

US 2006/0203456 A1    Sep. 14, 2006

(30) Foreign Application Priority Data

Mar. 11, 2005   (KR) .................. 10-2005-0020572

(51) Int. Cl.
*H01K 3/10* (2006.01)
(52) U.S. Cl. ........................ 29/852; 29/830; 29/832; 29/846
(58) Field of Classification Search ............. 29/830, 29/832, 840, 846, 852
See application file for complete search history.

(56) References Cited

U.S. PATENT DOCUMENTS

| 5,079,069 | A | | 1/1992 | Howard et al. |
| 5,155,655 | A | | 10/1992 | Howard et al. |
| 5,161,686 | A | | 11/1992 | Howard et al. |
| 5,162,977 | A | | 11/1992 | Paurus et al. |
| 6,023,407 | A | * | 2/2000 | Farooq et al. ............ 361/303 |
| 6,885,541 | B2 | * | 4/2005 | Otsuka et al. .......... 361/306.3 |
| 7,196,898 | B2 | * | 3/2007 | Osaka et al. ............ 361/321.1 |

FOREIGN PATENT DOCUMENTS

| JP | 2000-183536 | 6/2000 |
| JP | 2002-261449 | 9/2002 |
| KR | 1020010076476 A | 8/2001 |
| KR | 1020030061356 A | 7/2003 |
| KR | 1020040057151 A | 7/2004 |

\* cited by examiner

*Primary Examiner*—Carl J. Arbes
(74) *Attorney, Agent, or Firm*—Darby & Darby P.C.

(57) ABSTRACT

The present invention relates to a method of fabricating a printed circuit board having embedded multi-layer passive devices, and particularly, to a method of fabricating a printed circuit board having an embedded multi-layer capacitor, in which a capacitor is formed to have multiple layers in the PCB to increase capacitance.

6 Claims, 9 Drawing Sheets

METHOD OF FABRICATING PRINTED CIRCUIT BOARD HAVING EMBEDDED MULTI-LAYER PASSIVE DEVICES

INCORPORATION BY REFERENCE

The present application claims priority under 35 U.S.C. §119 to Korean Patent Application No. 10-2005-0020572 filed on Mar. 11, 2005. The content of the application is incorporated herein by reference in its entirety.

BACKGROUND OF THE INVENTION

1. Field of the Invention

The present invention relates, generally, to a method of fabricating a printed circuit board (PCB) having embedded multi-layer passive devices, and more particularly, to a method of fabricating a PCB having an embedded multi-layer capacitor, in which a capacitor is formed to have multiple layers in the PCB to increase capacitance.

2. Description of the Related Art

Although discrete chip resistors or discrete chip capacitors have been generally mounted on almost all PCBs to date, PCBs in which passive devices, such as resistors or capacitors are embedded have recently been developed.

In techniques of fabricating PCBs including embedded passive devices, the passive devices, such as resistors or capacitors, are inserted into outer layers or inner layers of the substrate using novel materials and processes, to substitute for conventional chip resistors and chip capacitors.

That is, the PCB including embedded passive devices means that the passive devices, for example, capacitors, are embedded in the inner layers of the substrate or outer layers thereof. Regardless of the size of the substrate itself, if a capacitor, serving as a passive device, is incorporated into the PCB, this is called an 'embedded capacitor'. Such a substrate is referred to as an 'embedded capacitor PCB'.

The most important characteristic of the embedded passive device PCB is that the passive device is integrally provided in the PCB without the need for mounting it on the substrate.

In general, fabrication techniques of the embedded passive device PCB are largely classified into three types.

First is a method of manufacturing a polymer thick film type capacitor, including applying a polymer capacitor paste, which is then heat cured, that is, dried, to realize a capacitor.

Specifically, this method includes applying the polymer capacitor paste on the inner layer of a PCB, and drying the applied polymer capacitor paste, on which a copper paste is then printed and dried to form an electrode, thereby obtaining an embedded capacitor.

Second is a method of manufacturing an embedded discrete type capacitor, including coating a PCB with a ceramic-filled photodielectric resin, which has been patented by Motorola Co. Ltd., USA.

The above method includes applying the photodielectric resin layers containing ceramic powder on upper and lower surfaces of the substrate, laminating copper foils on the resin layers to form upper and lower electrodes, forming circuit patterns, and then etching the photodielectric resins, thereby obtaining a discrete capacitor.

Third is a method of manufacturing an embedded capacitor, including separately inserting a dielectric layer having capacitance properties into inner layers of a PCB, so as to substitute for a decoupling capacitor mounted on a PCB, which has been patented by Sanmina Co. Ltd., USA.

In this regard, U.S. Pat. No. 5,079,069, granted to Sanmina Co. Ltd., USA, discloses an embedded capacitor PCB including two conductive layers and an insulating material layer (dielectric layer) inserted into the two layers, and a PCB including the embedded capacitor PCB.

The dielectric layer of the embedded capacitor PCB has a thickness of at least 0.5 mil (12.5 µm), and generally, 1-2 mil (25-50 µm). The conductive layer has a weight distribution of at least 0.5 oz./ft$^2$ (thickness: about 18 µm), and generally, 1 oz./ft$^2$.

In addition, U.S. Pat. Nos. 5,155,655 and 5,161,086, granted to Sanmina Co. Ltd., USA, disclose the use of a conductive layer obtained by surface treating a conductive foil to assure adhesion and capacitance density.

In addition, U.S. Pat. No. 5,162,977, granted to Sanmina Co. Ltd., USA, discloses a capacitive core element using high capacitance powder. In the above patent, pre-fired ceramic powder having a high dielectric constant of 500 or more (at least 10 times that of the epoxy) is contained in a dielectric layer, to increase decoupling ability.

However, such conventional techniques suffer because the capacitance is very low, thus decreasing actual usability. To solve the problems, although attempts to use a component material having high capacitance have been made, they have not yet reached desired product requirements.

SUMMARY OF THE INVENTION

Accordingly, the present invention has been made keeping in mind the above problems occurring in the related art, and an object of the present invention is to provide a PCB having embedded multi-layer passive devices, in which an embedded capacitor is realized to include a plurality of conductive layers and a plurality of dielectric layers, to increase capacitance.

In order to achieve the above object, the present invention provides a method of fabricating a PCB having embedded multi-layer passive devices, including the steps of applying an insulating layer on a base substrate constituting a core layer, and then laminating a resin coated copper (RCC) having a lower electrode layer on the insulating layer; removing the upper copper foil of the RCC, and then forming an inner electrode layer; repeating the lamination of the RCC in the applying and removing steps several times, to form a plurality of dielectric layers and a plurality of inner electrode layers; and forming a plurality of via holes through the PCB having the plurality of dielectric layers and the plurality of inner electrode layers, and then plating inner walls of the via holes to electrically conductively connect the inner electrode layers, to complete a multi-layer passive device.

DETAILED DESCRIPTION OF THE INVENTION

Hereinafter, embodiments of the present invention are described, with reference to the appended drawings.

FIGS. 1A to 1J sequentially illustrate a process of fabricating a PCB including an embedded multi-layer capacitor, according to an embodiment of the present invention.

Figure 1A:
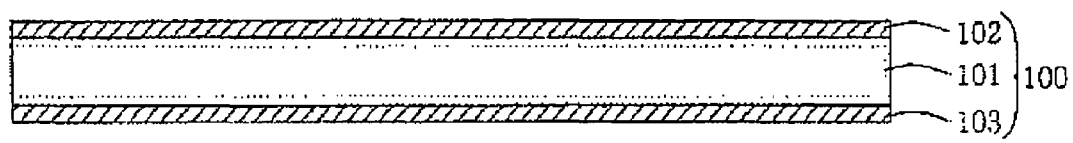
FIGS. 1A to 1J are sectional views sequentially showing a process of fabricating a PCB including an embedded multi-layer capacitor, according to an embodiment of the present invention.

As shown in FIG. 1A, a copper foil 102 of a base substrate 100 constituting a core layer undergoes an imaging process, to form a circuit pattern.

A copper clad laminate (CCL) used as the base substrate 100 is classified into glass/epoxy CCLs, heat resistant resin CCLs, paper/phenol CCLs, high frequency CCLs, flexible CCLs, complex CCLs, etc., depending on its uses. Of these CCLs, a glass/epoxy CCL 100 including an insulating resin layer 101 coated with copper foils 102, 103 is preferably used, in order to fabricate a double-sided PCB or a multi-layered PCB.

After a dry film (not shown) is applied on the base substrate 100, the dry film is exposed and developed, using an art work film having a predetermined printed pattern, thereby forming the dry film into a predetermined pattern. An etchant is sprayed, thereby removing the copper foil 102, corresponding to the region other than the region protected by the dry film. The dry film that was used is removed, forming a final wiring pattern of the copper foil 102.

The dry film consists of three layers, that is, a cover film, a photoresist film and a Mylar film, of which the photoresist film actually functions as a resist.

The exposure and development of the dry film are conducted by closely attaching the art work film having a predetermined pattern to the upper surface of the dry film and then radiating UV light onto the art work film.

As such, UV light does not transmit the black portion corresponding to the printed pattern of the art work film, whereas it transmits the portion with no pattern of the art work film, thus curing the dry film under the art work film.

When the CCL 102 having the cured dry film is dipped into a developer, the non-cured portion of the dry film is removed by the developer, and only the cured dry film remains to form a resist pattern. The developer includes, for example, an aqueous solution of sodium carbonate ($Na_2CO_3$) or potassium carbonate ($K_2CO_3$).

After the resist pattern is formed on the base substrate 100 using an imaging process, an etchant is sprayed to remove the copper foil 102, corresponding to the region with the exception of the region protected by the resist pattern, and also to remove the resist pattern used, forming a final wiring pattern of the copper foil 102.

Figure 1B:
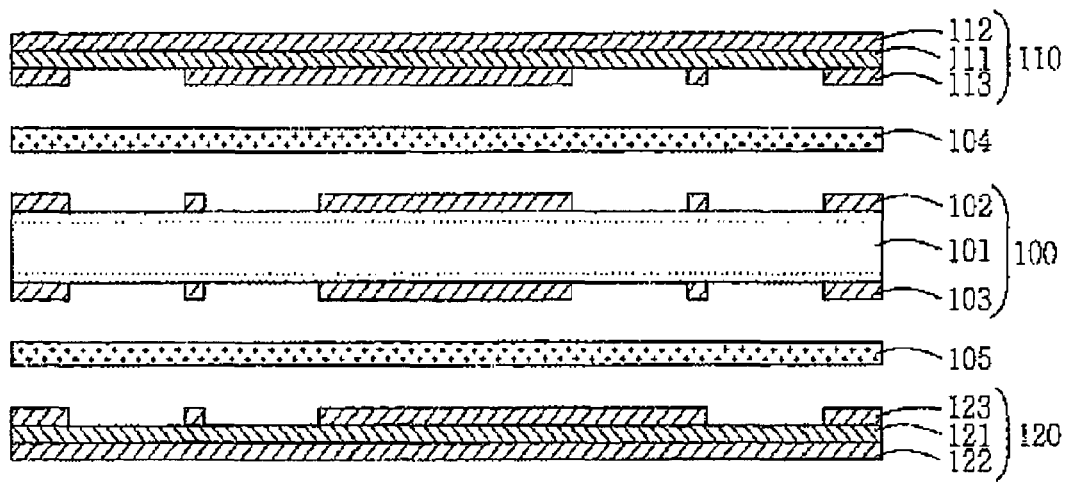

As shown in FIG. 1B, prepregs 104, 105 are laminated on both surfaces of the base substrate 100 having circuit patterns. CCLs 110, 120, each of which has a circuit pattern only on any one surface thereof, are laminated on the prepregs 104, 105, respectively.

The procedures for forming the circuit pattern on any one surface of each of the CCLs 110, 120 are the same as those for forming the circuit pattern on the base substrate 100 as mentioned above, provided that insulating layers 111, 121 of the CCLs 110, 120 are preferably formed of a material having high dielectric constant to realize a capacitor having high capacitance.

Figure 1C:
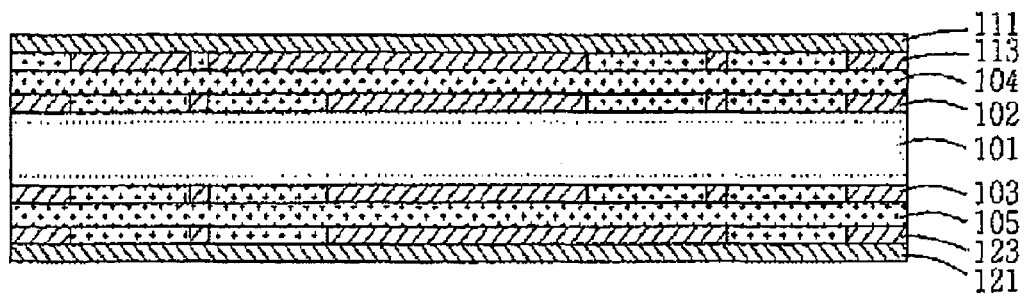

As shown in FIG. 1C, outermost copper foils 112, 122 are removed from the CCLs 110, 120. The reason why the outermost copper foils 112, 122 are removed from the CCLs 110, 120 is that the copper foil of a commonly used CCL is thick. If the copper foil of the CCL is used as an electrode layer of a multi-layer capacitor, the resultant PCB becomes thick according to the subsequent lamination of dielectric layers. In addition, since the conductive portion, used to form a pattern and then removed, should be filled with resin, product requirements are difficult to fulfill.

Figure 1D:
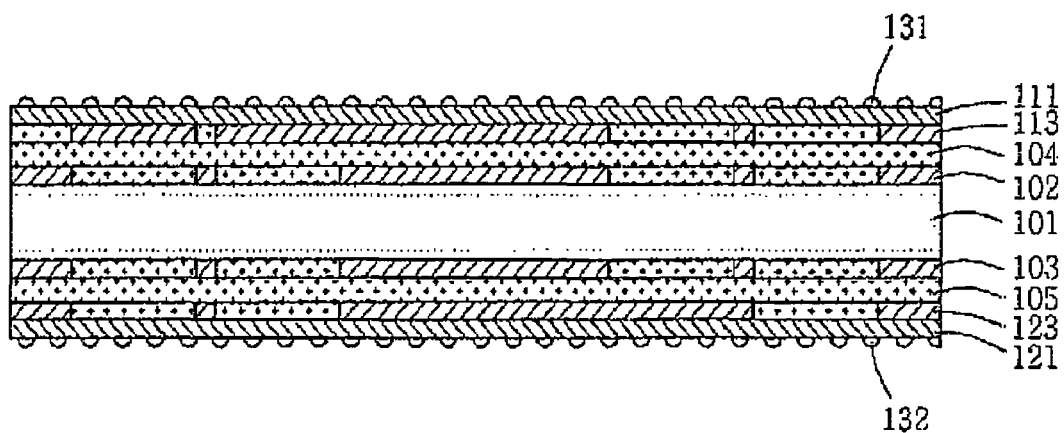

As shown in FIG. 1D, seed layers 131, 132 are provided to form inner electrode layers of a multi-layer capacitor embedded in a PCB.

The seed layers 131, 132 may be formed using an electroless plating process. The electroless plating process is conducted for an insulating material, not through an electrically charged ion reaction but through a deposition reaction, in particular, a deposition reaction to be accelerated using a catalyst.

Upon electroless plating, a catalyst should be attached to the surface of a material to be plated, so that copper is deposited from a plating solution. This means that electroless plating requires many pretreatment procedures.

For example, the electroless plating process includes the steps of cleaning, soft etching, pre-catalysis, catalysis, acceleration, electroless copper plating, and oxidation prevention.

The electroless copper plating process has physical properties inferior to a copper electroplating process, and thus may be used to form a thin copper plated layer.

Figure 1E:
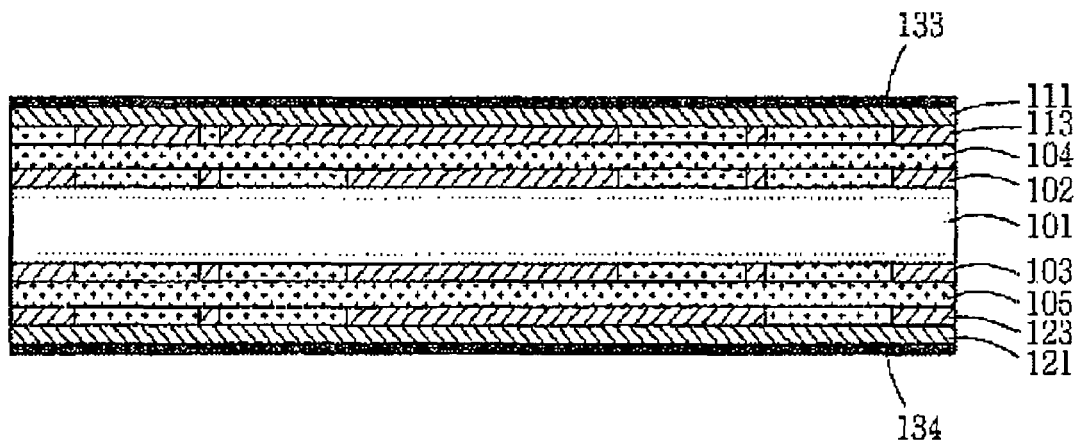

As shown in FIG. 1E, inner conductive layers 133, 134 for use in the formation of inner electrode layers of a multi-layer capacitor embedded in a PCB are formed using an electroplating process.

Figure 1F:
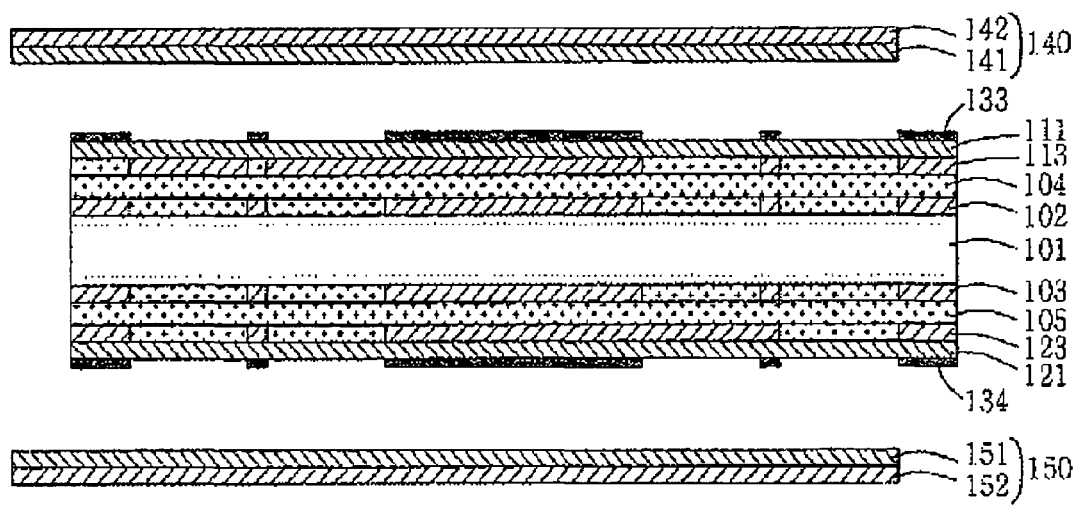

As shown in FIG. 1F, the inner conductive layers 133, 134 are patterned using an imaging process, to form the inner electrode layers.

Figure 1G:
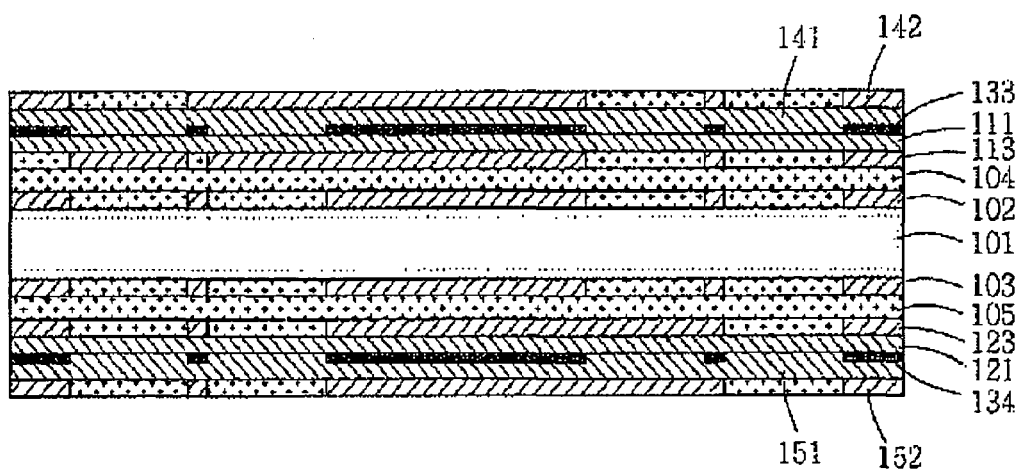

As shown in FIGS. 1F and 1G, the procedures for patterning the electroplated layer shown in FIGS. 1B to 1F are repeated, to form a desired multi-layer capacitor, if necessary.

That is, the procedures of laminating a prepreg to form a dielectric layer, laminating a CCL having a lower pattern, removing an upper copper foil, and forming an inner electrode layer of a multi-layer capacitor using electroless plating and electroplating, are repeated if desired.

Figure 1H:
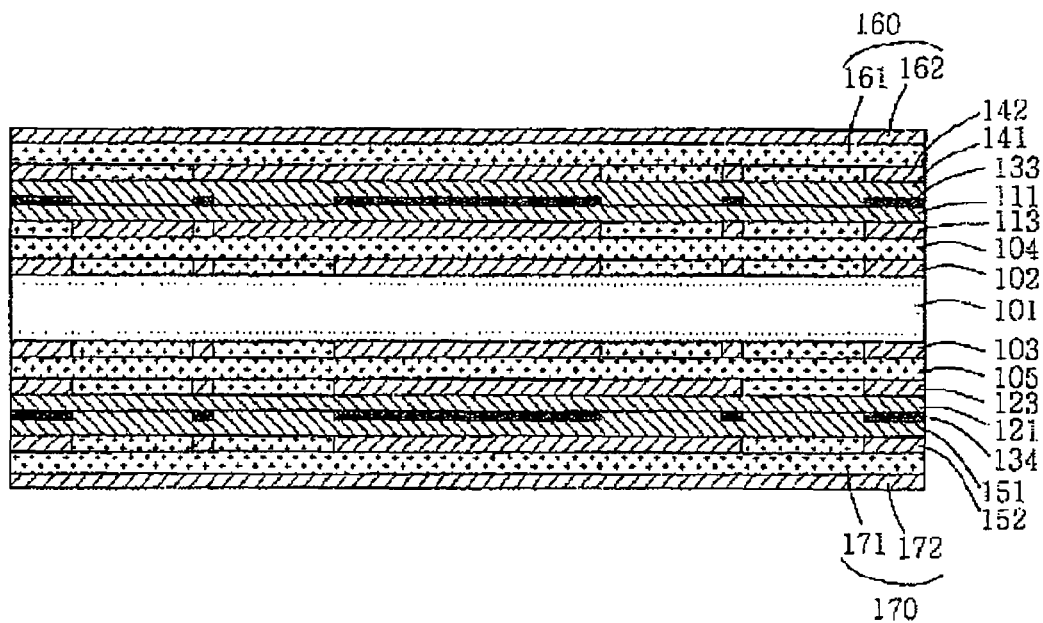

After the inner conductive layers 133, 134 are patterned using an imaging process to form inner electrode layers, RCCs are laminated to form dielectric layers 161, 171, as shown in FIG. 1H, and then copper foils 162, 172 of the RCCs are patterned to form upper electrode layers, as shown in FIG. 1G.

Figure 1I:
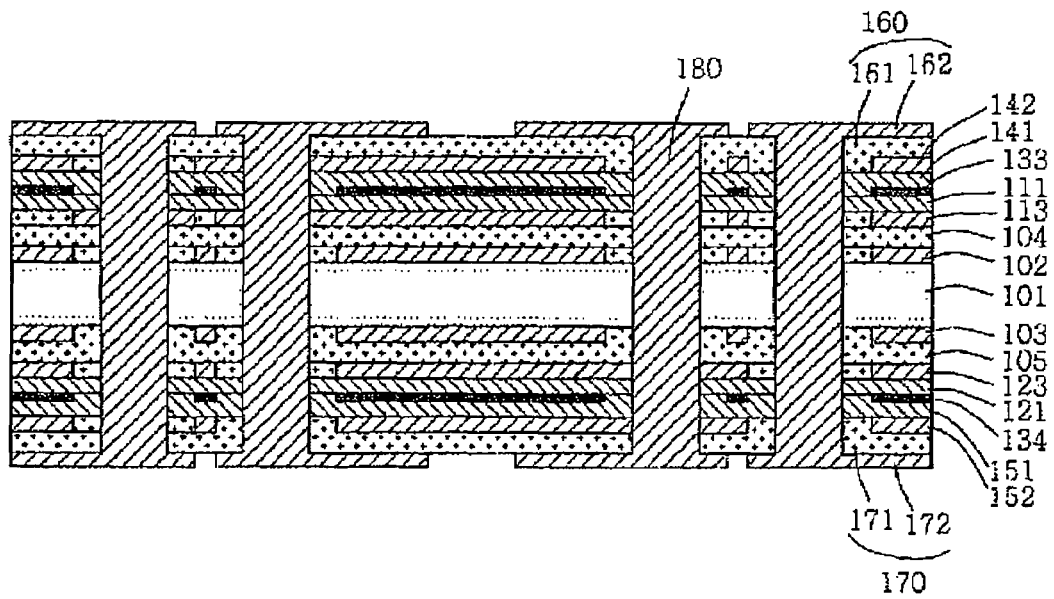

As shown in FIG. 1I, a via hole (not shown) or through hole is formed in the multi-layered PCB, after which the inner wall of the via hole or through hole is plated to form a plated layer 180, to electrically conductively connect the inner electrode layers of the multi-layer structure so as to realize a desired multi-layer capacitor.

The via hole or through hole is preferably formed in a manner such that a via hole or through hole is formed in a pre-set position using a laser or a CNC (Computer Numerical Control) drill.

A CNC drill is suitable for use in the formation of the via hole in a double-sided PCB or the through hole in a multi-layered PCB.

After the via hole or through hole is processed using a CNC drill, it is preferable that a deburring process be conducted to remove burrs of copper foil, dust in the via hole, and dust on the copper foil, generated upon drilling. At this step, the surface of the copper foil is roughened, thereby increasing adhesion with copper in a subsequent copper plating process.

A laser is suitable for use in the formation a micro via hole in a multi-layered PCB. Both the copper foil and the insulating resin layer are simultaneously processed using a laser, in particular, a YAG (Yttrium Aluminum Garnet) laser. In addition, the copper foil, corresponding to the portion of the via hole, may be etched and then the insulating resin layer may be processed using a carbon dioxide laser.

After forming the via hole, it is preferable that a desmearing process be conducted to remove smears formed on the side wall of the via hole by melting the insulating resin layer of the base substrate due to heat generated upon formation of the via hole.

Figure 1J:
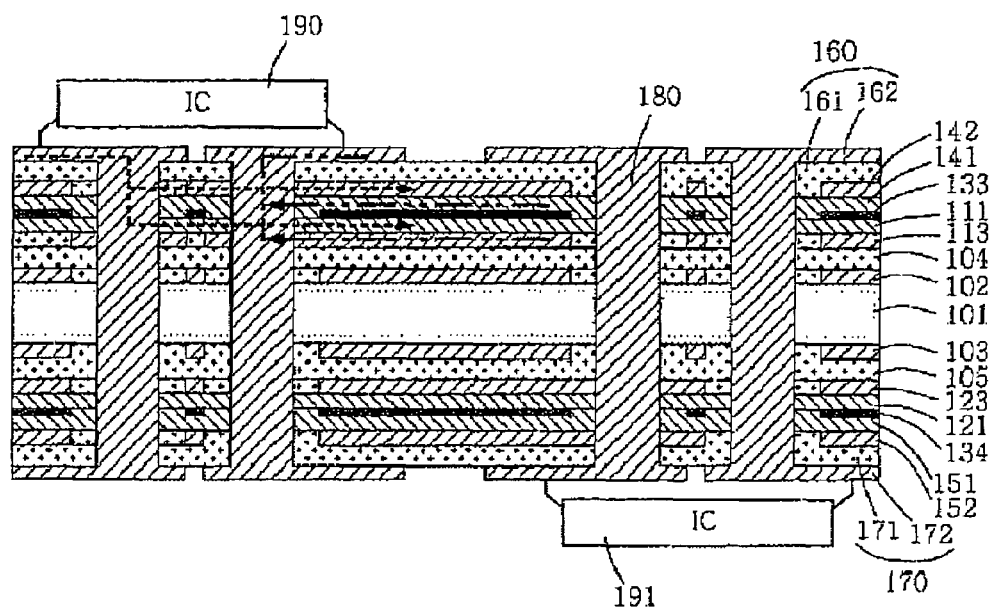

As shown in FIG. 1J, integrated circuit (IC) chips 190, 191 are mounted on the PCB having a multi-layer capacitor, to complete a semiconductor chip package.

Turning now to FIGS. 2A to 2J, a process of fabricating a PCB including an embedded multi-layer capacitor, according to another embodiment of the present invention, is sequentially illustrated.

Figure 2A:
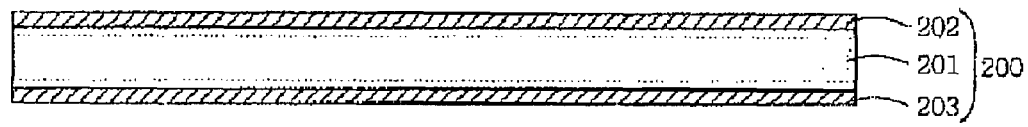
FIGS. 2A to 2J are sectional views sequentially showing a process of fabricating a PCB including an embedded multi-layer capacitor, according to another embodiment of the present invention.

As shown in FIG. 2A, copper foils 202, 203 of a base substrate 200 constituting a core layer are subjected to an imaging process, to form circuit patterns. The base substrate 200 is the same as the base substrate 100 used in the previous embodiment, which is exemplified by glass/epoxy CCLs, heat resistant resin CCLs, paper/phenol CCLs, high frequency CCLs, flexible CCLs, complex CCLs, etc., depending on uses thereof. Of these CCLs, the use of a glass/epoxy CCL is preferable.

Figure 2B:
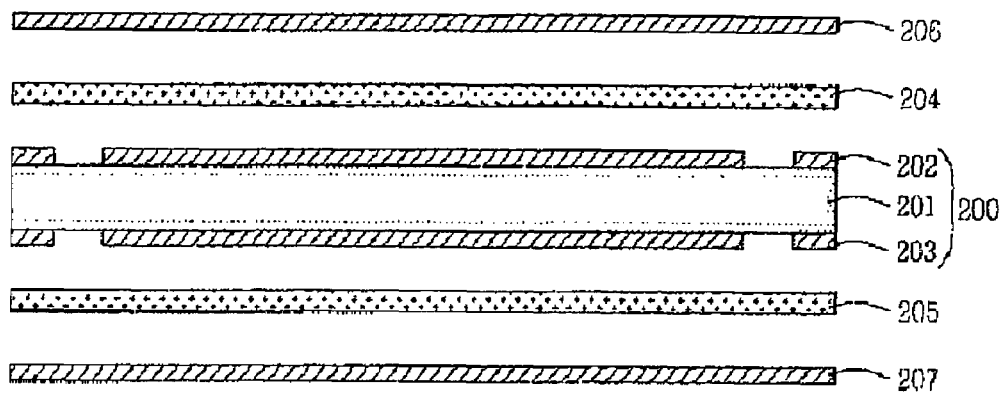
Figure 2C:
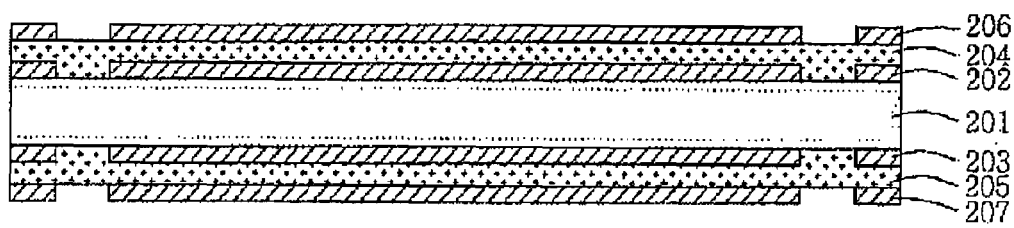

As shown in FIG. 2B, prepregs 204, 205 are laminated on both surfaces of the base substrate 200 having circuit patterns. Thereafter, thin foils 206, 207, each of which is to be a lower electrode of a multi-layer capacitor embedded in a PCB, are laminated on the prepregs 204, 205, respectively. Subsequently, circuit patterns are provided, as shown in FIG. 2C.

The procedures for forming the circuit patterns on the foils 206, 207 are the same as those for forming the circuit pattern on the base substrate 200 as mentioned above.

Figure 2D:
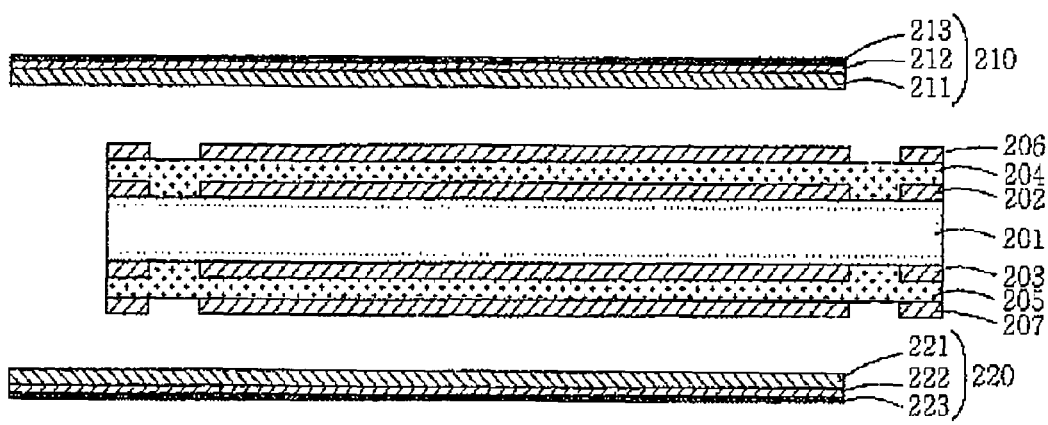

As shown in FIG. 2D, ultrathin foil carriers 210, 220, including dielectric layers 211, 221 having high dielectric constants, very thin foils 212, 222 laminated on the dielectric layers 211, 221, and carriers 213, 223 laminated on the foils 212, 222, are laminated.

Figure 2E:
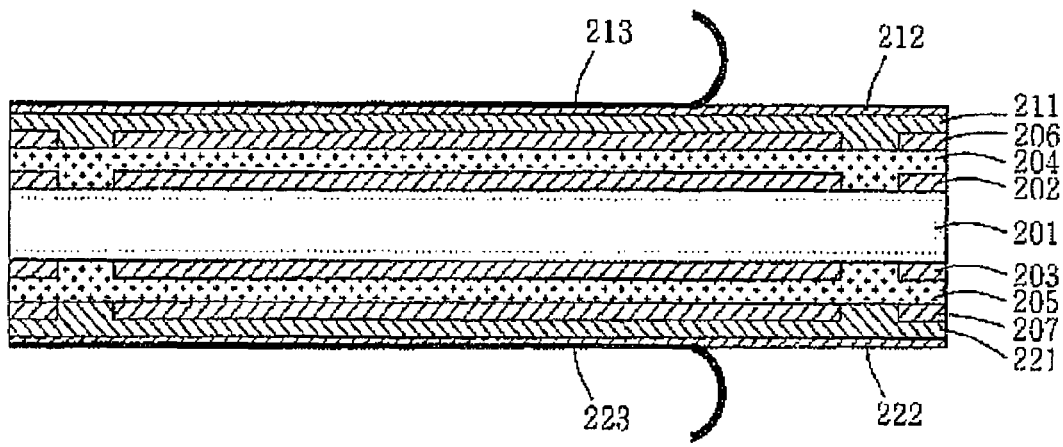

The carriers 213, 223 are used to carry the RCCs formed of the dielectric layers 211, 221 and the foils 212, 222, and are then removed after the RCCs are attached to the foils 206, 207 forming lower electrodes, as shown in FIG. 2E.

Figure 2F:
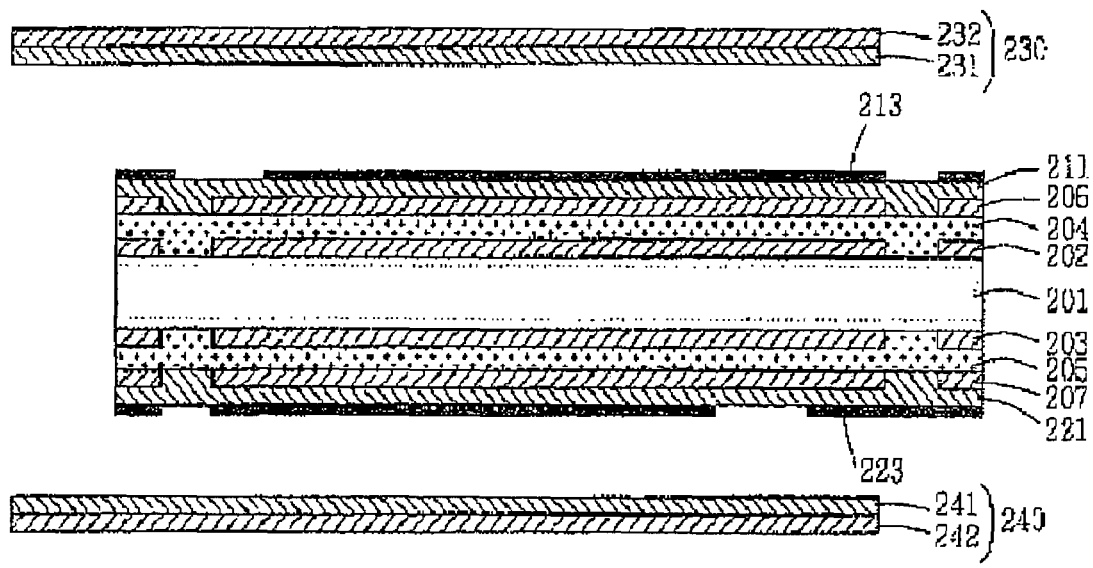

As shown in FIG. 2F, the foils 212, 222 are patterned using an imaging process and thus may function as inner electrode layers. Using a carrier (not shown), a plurality of RCCs (in the present embodiment, the upper RCC 230 and lower RCC 240 are laminated on upper and lower surfaces, respectively) may be further laminated to satisfy product requirements, that is, to form multiple dielectric layers and inner electrode layers.

Figure 2G:
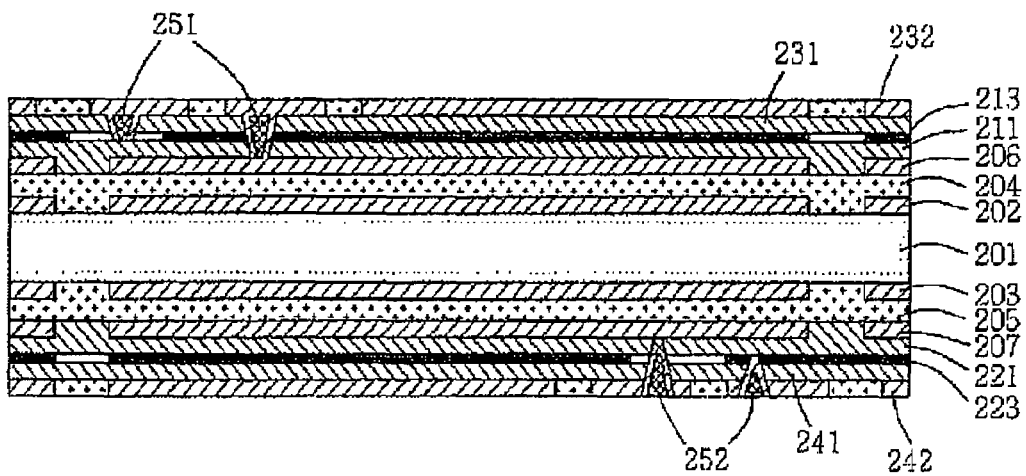

FIG. 2G illustrates the multi-layer capacitor thus formed. Via holes 251, 252 are processed for electrical connection of the inner electrode layers.

The via hole is preferably formed in a manner such that a via hole is formed in a pre-set position using a CNC drill or laser as mentioned above.

A CNC drill is suitable for the formation of the via hole in a double-sided PCB or the through hole in a multi-layered PCB.

A laser is suitable for the formation of the micro via hole in a multi-layered PCB. Both the copper foil and the insulating resin layer may be simultaneously processed using a laser, in particular, a YAG (Yttrium Aluminum Garnet) laser. Alternatively, the copper foil, corresponding to the portion of the via hole, may be etched, and then the insulating resin layer may be processed using a carbon dioxide laser.

Figure 2H:
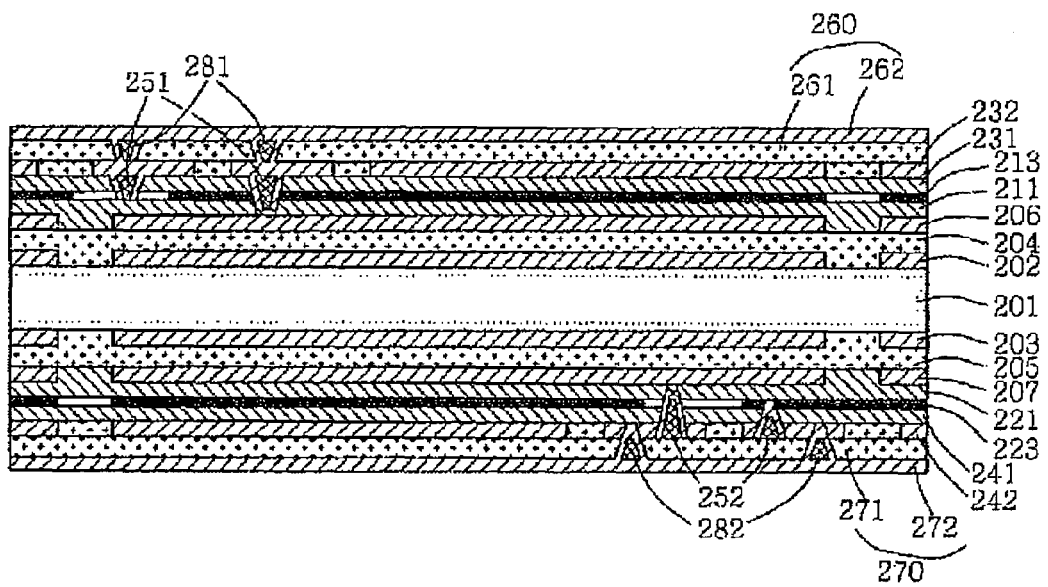
Figure 2I:
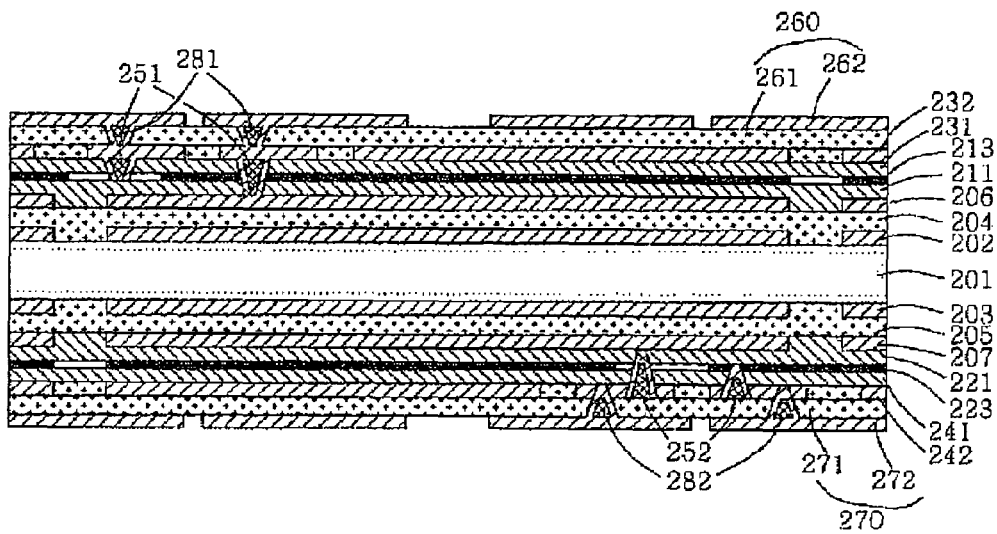

As shown in FIGS. 2H and 2I, RCCs 260, 270 are laminated, and then outermost foils 262, 272 are patterned using an imaging process, to form outer electrode layers.

In addition, a plurality of via holes 281, 282 are formed, so that the inner electrode layers can be electrically conductively connected to the outer electrode layers and the inner electrode layers can be electrically connected to each other, thereby forming a multi-layer capacitor.

Figure 2J:
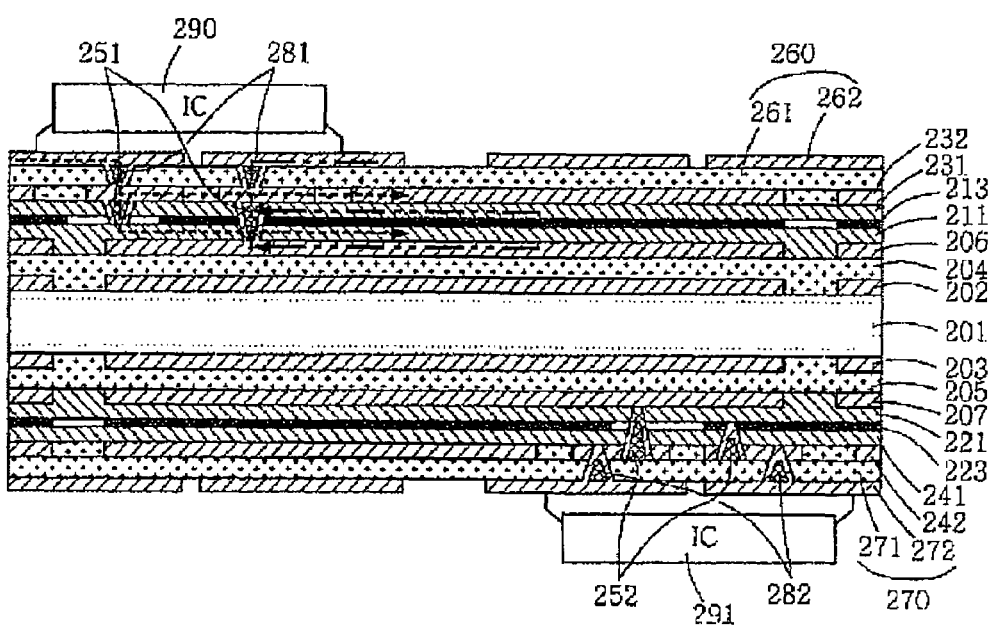

As shown in FIG. 2J, IC chips are mounted to complete a semiconductor chip package.

In the PCB having an embedded multi-layer capacitor of the present invention, the number of conductive layers of the capacitor may be three or more, and the number of insulating layers thereof may be two or more.

Further, it is possible to form RCC or CCL type layers having capacitance to be a multi-layer through a collective lamination process or a building-up process.

As the thickness of the insulating layer of the multi-layer capacitor is decreased and the number of insulating layers is increased, capacitance increases. In addition, the inner conductive layer of the multi-layer capacitor should be formed as thin as possible for decreasing the thickness of the resultant PCB and realizing the thickness uniformity of the insulating layer.

To decrease the thickness of the inner conductive layer, the conductive layer may be formed using an originally thin foil (0.5 oz./ft$^2$≈18 μm or less, 3-9 μm foil). In addition, the conductive layer (5 μm or less thick) may be formed by laminating RCC or CCL, removing the outermost thick conductive foil, forming a seed layer through electroless plating, and then forming a desired conductive layer through electroplating. In addition, the conductive layer may be formed by laminating surface processed RCC or CCL and then partially removing the outermost thick conductive foil.

As described above, the present invention provides a method of fabricating a PCB including embedded multi-layer passive devices, which can exhibit higher performance (decoupling or matching) on the same board area using the same material (having the properties, such as a dielectric constant, thickness, etc.).

According to the method of the present invention, in the case where patterning is used to design current flow to be reverse, an embedded capacitor PCB having good high frequency properties due to offset effects of inductance can be fabricated.

According to the method of the present invention, the advantage of the multi-layer structure can be sufficiently exhibited to obtain capacitance density greatly affecting decoupling to a desired level.

According to the method of the present invention, in the case where a dielectric filler is used to assure a dielectric constant of a predetermined level or more for signal matching, since the problems such as poor temperature properties may result, a polymer material having superior properties in addition to a low dielectric constant is designed in the form of multiple layers, thus capacitance can be increased to a necessary level or more without degrading other properties.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a printed circuit board having embedded multi-layer passive devices, comprising the steps of:
    applying an insulating layer on a base substrate constituting a core layer, and then laminating a resin coated copper (RCC) having a lower electrode layer on the insulating layer;
    removing an upper copper foil of the RCC, and forming an inner electrode layer;
    repeating the laminating of the RCC in the applying and removing steps several times, to form a plurality of dielectric layers and a plurality of inner electrode layers; and
    forming a plurality of via holes through the printed circuit board having the plurality of dielectric layers and the plurality of inner electrode layers, and plating inner walls of the via holes to electrically conductively connect the inner electrode layers.

2. The method as set forth in claim 1, wherein the removing step includes the steps of:
    removing the upper copper foil of the RCC laminated on the insulating layer;
    forming a seed layer on an insulating layer of the RCC without the upper copper foil, using electroless plating; and
    forming the inner electrode layer on the seed layer, using electroplating.

3. The method as set forth in claim 2, wherein the inner electrode layer has a thickness of 0.1-5 µm.

4. A method of fabricating a printed circuit board having embedded multi-layer passive devices, comprising the steps of:
    applying an insulating layer on a base substrate constituting a core layer, and forming a lower electrode layer;
    forming an insulating layer and an inner electrode layer on the lower electrode layer using an ultrathin foil carrier;
    processing a via hole through the printed circuit board having the insulating layer and the inner electrode layer to electrically connect inner electrode layers; and
    repeating the forming and processing steps to form a plurality of insulating layers and a plurality of inner electrode layers.

5. The method as set forth in claim 4, wherein the applying step includes the steps of:
    laminating a prepreg on the base substrate constituting the core layer, to form the insulating layer; and
    laminating a foil on the insulating layer, and forming the lower electrode layer using an imaging process.

6. The method as set forth in claim 4, wherein the forming step includes the steps of:
    laminating a resin coated copper (RCC), comprising an insulating layer coated with a thin film, on the lower electrode layer using the ultrathin foil carrier;
    removing a carrier from the ultrathin foil carrier, to expose the thin film of the RCC; and
    subjecting the thin film to the imaging process, to form the inner electrode layer.

* * * * *